United States Patent
Shahin et al.

(10) Patent No.: US 10,923,884 B2
(45) Date of Patent: Feb. 16, 2021

(54) TWO-SECTION EDGE-EMITTING LASER

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/413,505

(22) Filed: May 15, 2019

(65) Prior Publication Data

US 2020/0366065 A1 Nov. 19, 2020

(51) Int. Cl.
*H01S 5/10* (2006.01)
*H01S 5/40* (2006.01)
*H01S 5/0625* (2006.01)

(52) U.S. Cl.
CPC .......... *H01S 5/4037* (2013.01); *H01S 5/0625* (2013.01); *H01S 5/1025* (2013.01); *H01S 5/1028* (2013.01); *H01S 5/4062* (2013.01)

(58) Field of Classification Search
CPC .... H01S 5/0625; H01S 5/1025; H01S 5/1028; H01S 5/164; G02B 27/0172
See application file for complete search history.

(56) References Cited

U.S. PATENT DOCUMENTS

| | | | | |
|---|---|---|---|---|
| 5,574,742 A | * | 11/1996 | Ben-Michael | G02B 6/1228 372/45.01 |
| 5,812,577 A | * | 9/1998 | Dawson | B82Y 20/00 372/45.01 |
| 9,297,996 B2 | * | 3/2016 | Bohn | G02B 26/00 |
| 2002/0075923 A1 | * | 6/2002 | Tashiro | H01S 5/162 372/45.01 |
| 2005/0105577 A1 | * | 5/2005 | Fukuhisa | H01S 5/2231 372/50.1 |
| 2007/0223857 A1 | | 9/2007 | Nunoya et al. | |
| 2018/0314325 A1 | * | 11/2018 | Gibson | G06F 3/013 |

FOREIGN PATENT DOCUMENTS

JP S61188989 A 8/1986

OTHER PUBLICATIONS

Gontijo, et al., "Very low Loss Extended Cavity GaAs/AlGaAs Lasers made by Impurity-free Vacancy Diffusion", in IEEE Published in Electronics Letters, vol. 30, Issue 2, Jan. 1994, pp. 145-146.

(Continued)

*Primary Examiner* — Michael Carter
(74) *Attorney, Agent, or Firm* — Alleman Hall Creasman & Tuttle LLP

(57) ABSTRACT

A system includes a waveguide and an edge-emitting laser. The edge-emitting laser is configured to lase coherent light into the waveguide. The edge-emitting laser includes an optical cavity having an active gain section and a passive section. The active gain section is configured to amplify an optical power of light reflecting within the optical cavity. The passive section increases a functional length of the optical cavity such that a total length of the optical cavity reduces fringe interference of the coherent light propagating through the waveguide.

20 Claims, 7 Drawing Sheets

(56) References Cited

OTHER PUBLICATIONS

Ooi, et al., "Integration Process for Photonic Integrated Circuits using Plasma Damage Induced Layer Intermixing", in IEEE Published in Electronics Letters, vol. 31, Issue 6, Mar. 1995, pp. 449-451.

"International Search Report and Written Opinion Issued in PCT Application No. PCT/US2020/028023", dated Jul. 10, 2020, 14 Pages.

* cited by examiner

TWO-SECTION EDGE-EMITTING LASER

BACKGROUND

Laser scanning micro-electro-mechanical systems (MEMS) based displays have several advantages over liquid crystal displays (LCDs) and liquid crystal on silicon (LCOS) displays. Such advantages include smaller size, lighter weight, lower power consumption, and higher brightness and contrast. In a waveguide-based laser scanning display, image light beams emitted from the laser are coupled into one or more waveguides. These light beams propagate through the waveguide(s), while being replicated, and then are coupled out of the waveguide(s) into a user's eyes.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A system includes a waveguide and an edge-emitting laser. The edge-emitting laser is configured to lase coherent light into the waveguide. The edge-emitting laser includes an optical cavity having an active gain section and a passive section.

DETAILED DESCRIPTION

In a waveguide-based laser scanning display, there are myriad (e.g., millions) light paths resulting from multiple interactions of image light beams propagating through a waveguide and grating structures (e.g., surface relief grating SRG). As such, there are myriad possible interactions between light beams with different optical path lengths (OPLs). A laser is a coherent light source where certain OPLs that are proportional to an optical cavity length of the laser form temporal coherence peaks. If an OPL of the waveguide matches any of the coherence OPLs of the laser, an interference fringe may be formed. An interference fringe may create an artifact in an image presented by the waveguide-based laser scanning display. Such an artifact may degrade the perceived image quality of the waveguide-based laser scanning display.

Accordingly, the present disclosure is directed to a waveguide-based laser scanning display including an edge-emitting laser configured to lase coherent light into a waveguide. The edge-emitting laser includes an optical cavity having a total length that reduces or avoids fringe interference of the coherent light propagating through the waveguide. In particular, the optical cavity length may be tuned to ensure that the OPLs supported by the waveguide do not match the coherence OPLs of the coherent light output from the laser. For example, increasing the optical cavity length to larger than a maximum OPL supported by the waveguide guarantees avoiding all fringe interference.

Increasing the optical cavity in a manner that increases the length of the active gain section causes an increase in the laser threshold current, and hence the power consumption of the laser. To both reduce/avoid fringe interference and keep the laser power consumption low, the optical cavity may be configured to have both an active gain section and a passive section. The active gain section is configured to amplify an optical power of light reflecting within the optical cavity. The passive section increases a functional length of the optical cavity without further amplifying the optical power of the light reflecting within the optical cavity. In this way, the overall length of the optical cavity satisfies the fringe mitigation requirements while the laser's output power and power consumption is determined mainly by the length of the active gain section. Such a laser may consume less power than a laser having the same optical cavity, but where the active gain section occupies the entire length of the optical cavity instead of achieving the greater optical cavity length with a passive section.

Figure 1:
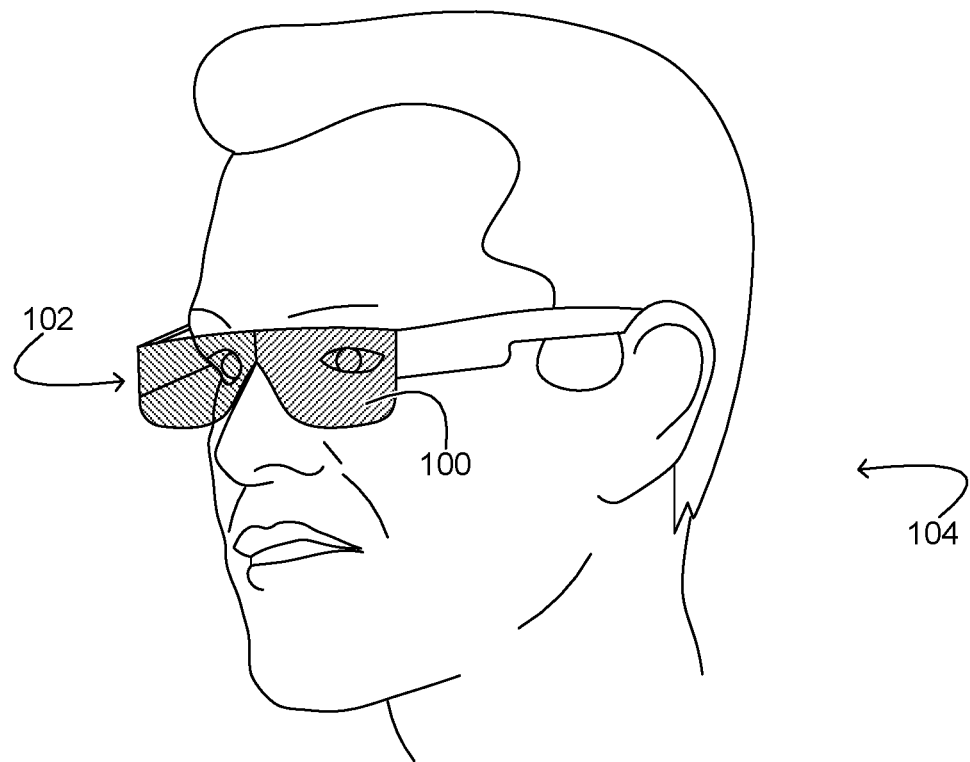
FIG. 1 shows aspects of an example implementation environment for a near-eye display system.

FIG. 1 shows aspects of an example implementation environment for a near-eye display system 100. As illustrated herein, near-eye display system 100 is a component of a head-mounted electronic device 102, which is worn and operated by a user 104. The near-eye display system 100 is configured to present virtual imagery in the user's field of view. In some implementations, user-input componentry of the wearable electronic device 104 may enable the user to interact with the virtual imagery. The wearable electronic device 102 takes the form of eyeglasses in the example of FIG. 1. In other examples, the wearable electronic device 102 may take the form of goggles, a helmet, or a visor. In still other examples, the near-eye display system 100 may be a component of a non-wearable electronic device, such as a heads-up display.

The near-eye display system 100 may be configured to cover one or both eyes of the user 104 and may be adapted for monocular or binocular image display. In examples in which the near-eye display system 100 covers only one eye, but binocular image display is desired, a complementary near-eye display system may be arranged over the other eye. In examples in which the near-eye display system covers both eyes and binocular image display is desired, the virtual imagery presented by near-eye display system 100 may be divided into right and left portions directed to the right and left eyes, respectively. In scenarios in which stereoscopic image display is desired, the virtual imagery from the right and left portions, or complementary near-eye display systems, may be configured with appropriate stereo disparity so as to present a three-dimensional subject or scene.

Figure 2:
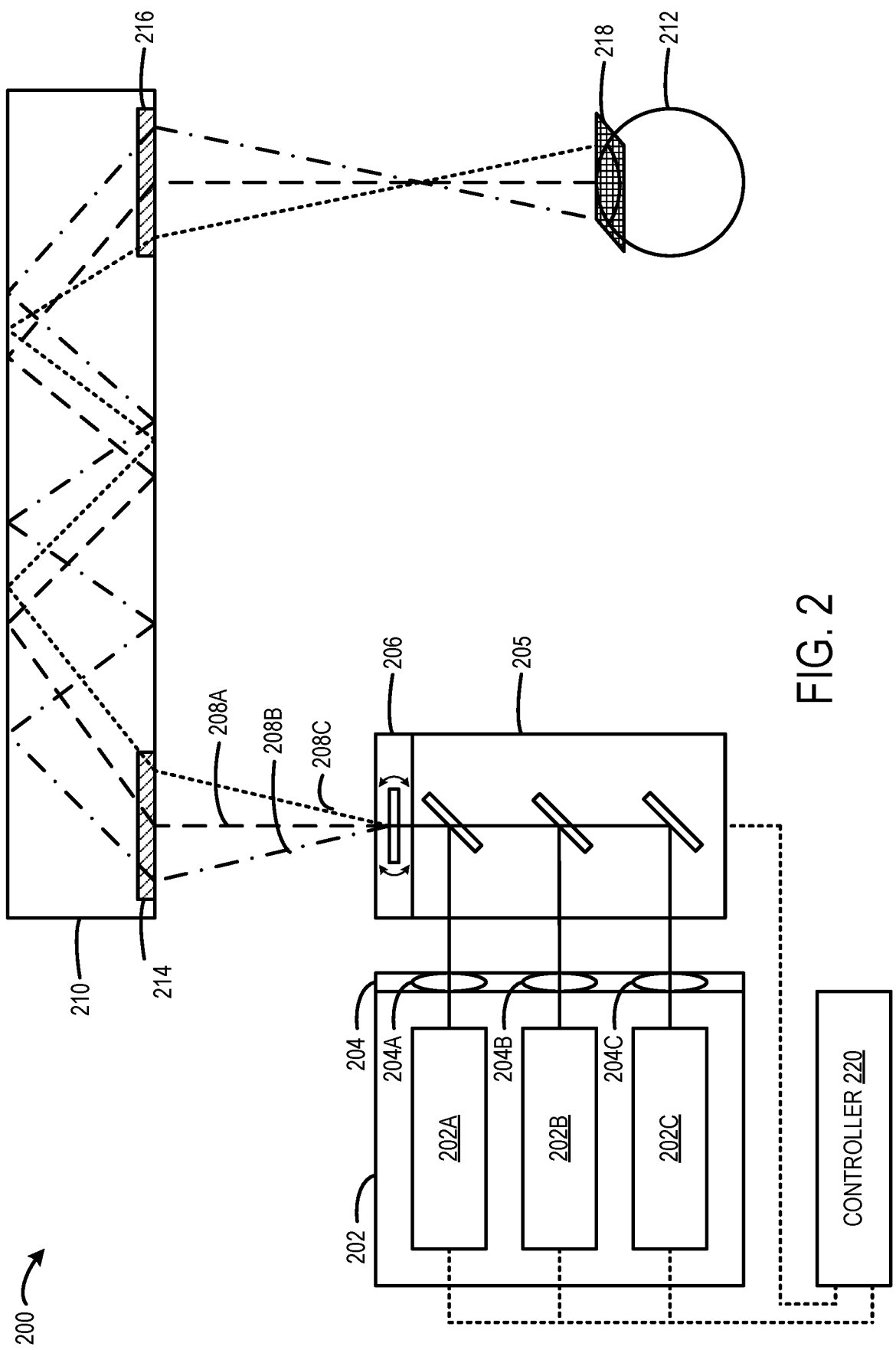
FIG. 2 schematically shows an example near-eye display system.

FIG. 2 shows an example near-eye display system 200 that uses a laser assembly 202 as an illumination source. The laser assembly 202 includes lasers 202A (e.g., a red laser), 202B (e.g., a green laser), and 202C (e.g., a blue laser). Although only three lasers are shown, it will be appreciated that the laser assembly 202 may include any suitable number of lasers. For example, the laser assembly 202 may include 0, 1, 2, 3, or more than 3 red lasers; 0, 1, 2, 3, or more than 3 green lasers; 0, 1, 2, 3, or more than 3 blue lasers; and 0, 1, 2, 3, or more than 3 lasers of other colors. Any combination or modification in the number of lasers may also be available (e.g., 2 red, 2 green, 2 blue, or 1 red, 1 green, 2 blue, etc.). Accordingly, any number of lasers may be used to irradiate/illuminate pixels for generating image content.

In some instances (though not all), the laser assembly 202 also includes a collimating lens assembly 204 (or other diffractive optical element) that is structured to direct light to another location or otherwise operate on the light in some manner. In this example, each of the lasers 202A, 202B, and 202C has a corresponding collimating lens 204A, 204B, 204C. In some implementations, however, a single collimating lens may be used for more than one laser.

The near-eye display 200 includes combination optics 205 configured to spatially combine the light beams lased from the plurality of lasers 202A, 202B, and 202C into a single light beam.

The near-eye display 200 includes a micro-electro-mechanical mirror system (MEMs) 206, though the principles disclosed herein are applicable to any type of laser-based display unit and not only to architectures with the MEMs 206. The MEMs 206 is configured to collect laser light from the combination optics 205, which combines light lased from three different sources (i.e., the lasers 202A, 202B, and 202C) into a single light beam. Additionally, the MEMs 206 is configured to direct laser light 208A (which, in this example includes red laser light, green laser light, and blue laser light) to a waveguide 210. Furthermore, the MEMs 206 is configured to redirect its mirrors/mirror array so that the laser light 208A is aimed at different locations at the waveguide 210. As shown, laser lights 208B and 208C are aimed at different locations on the waveguide 210. In this manner, the MEMs 206 is able to route light to different locations by adjusting the aim of its corresponding mirror array. It will be appreciated that the laser lights 208A-C may be modulated to include varying degrees or intensities (or even an absence of any one or more) of red, green, blue, or other color, laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMs 206 is able to use waveguide 210 to propagate light towards the user's eye 212.

The laser assembly 202 and the MEMs 206 may be controlled by a controller 220. The controller 220 may be configured to control the MEMs 206, in conjunction with the laser assembly 202 to progressively scan a set of pixels 218 to a target display area for a user's eye 212 to view (e.g., by adjusting the mirror array so that the combined RGB laser beam or light is aimed at different locations) individual pixels of that image in such a rapid manner that the entirety of the image appears before the user's eye 212 without the user realizing that the image was progressively scanned pixel by pixel and line by line. In this way, the near-eye display system 200 may project or render image content for a user to view.

The MEMs 206 may be able to scan an image (i.e., pixels of that image) at any image resolution or range of image resolutions (e.g., in cases where foveated rendering is used). For example, in some implementations, the MEMs 206 is configured to scan RGB light from the laser assembly 202 with a resolution of 2,000 pixels by 1,200 pixels, or any other resolution.

Figure 3:
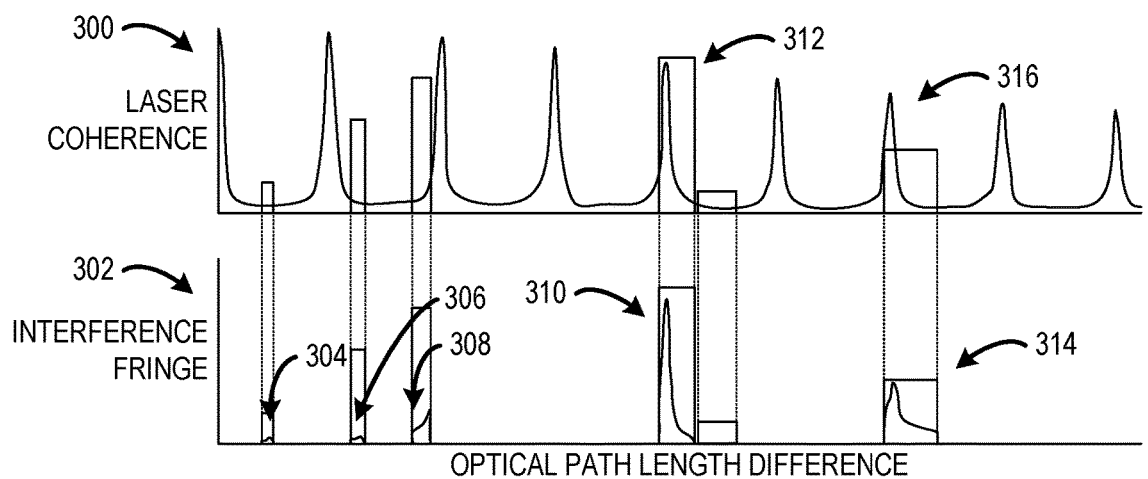
FIG. 3 shows a graph indicating that light output from a laser has coherence peaks that overlap with interference fringes of a waveguide.

There are various instances in which, due to the wave properties of laser light, fringe interference can occur. Laser light output from the waveguide is a composite of multiple separate waveforms with different optical path lengths (OPLs). Such a composite waveform may have multiple peaks (i.e., coherence peaks where OPLs of different light beams have temporal coherence) and valleys as a result of combining each of the multiple waveforms. FIG. 3 shows a graph 300 of an example composite waveform of laser light output from a laser. The composite waveform has a plurality of coherence peaks spaced apart by valleys. The distance between the coherence peaks is proportional to the effective length of the optical cavity of the laser. The shape of the coherence peaks is defined by the laser gain spectrum of the laser. In this example, the active gain section occupies the entire optical cavity and has a length of 300 μm.

Figure 4:
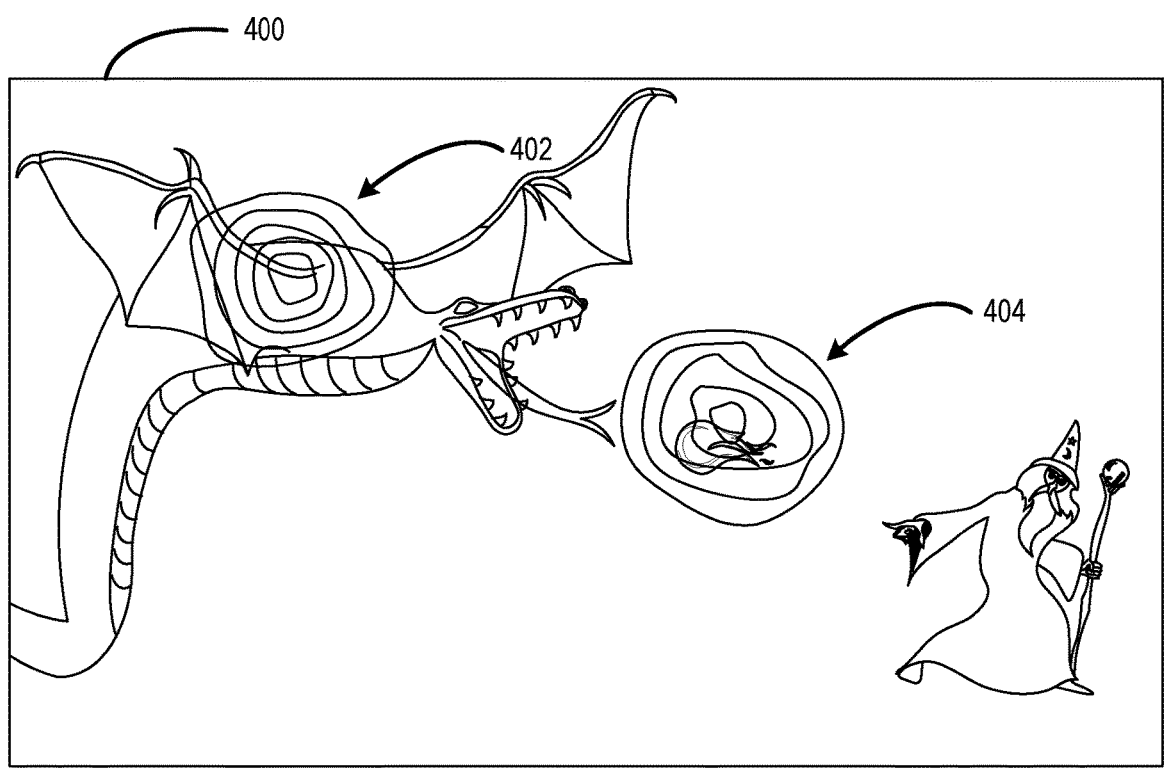
FIG. 4 shows an example image having interference fringe artifacts.

Additionally, FIG. 3 shows a graph 302 of interference fringes of the waveguide. In instances where the interference fringes do not overlap with the coherence peaks of the laser light, the interference fringes do not create artifacts in an image output from the waveguide. In the depicted example, interference fringes 304, 306, and 308 do not overlap with coherence peaks of the laser light and thus do not create artifacts in the image. However, interference fringe 310 overlaps with coherence peak 312 and interference fringe 314 overlaps with coherence peak 316. These overlapping interference fringes create artifacts in the image output from the waveguide. For example, these interference fringes may result from back scattering and/or back reflections combining with the outgoing laser light exiting the waveguide. As a result of these interference fringes, various different bright and dark rings/spots are created. FIG. 4 shows an example image 400 including artifacts 402 and 404 caused by such interference fringes. The artifacts 402, 404 include irregularities in terms of brightness. The presence of such artifacts in an image can lower the perceived quality of the image and thereby negatively affect the user experience. In the depicted example, the artifact 402 distorts the appearance of a dragon in image 400. Further, the artifact 404 distorts the appearance of a fireball shot by a wizard at the dragon.

In order to reduce fringe interference that creates artifacts in an image output from the waveguide, a laser assembly may be designed to reduce or avoid fringe interference of coherent light propagating through the waveguide. Such a laser assembly may include an optical cavity having a total length that is tuned to ensure that the OPLs supported by the waveguide do not match the coherence OPLs of the coherent light output from the laser. For example, increasing the optical cavity length to larger than a maximum OPL supported by the waveguide guarantees avoiding all fringe interference.

Figure 5:
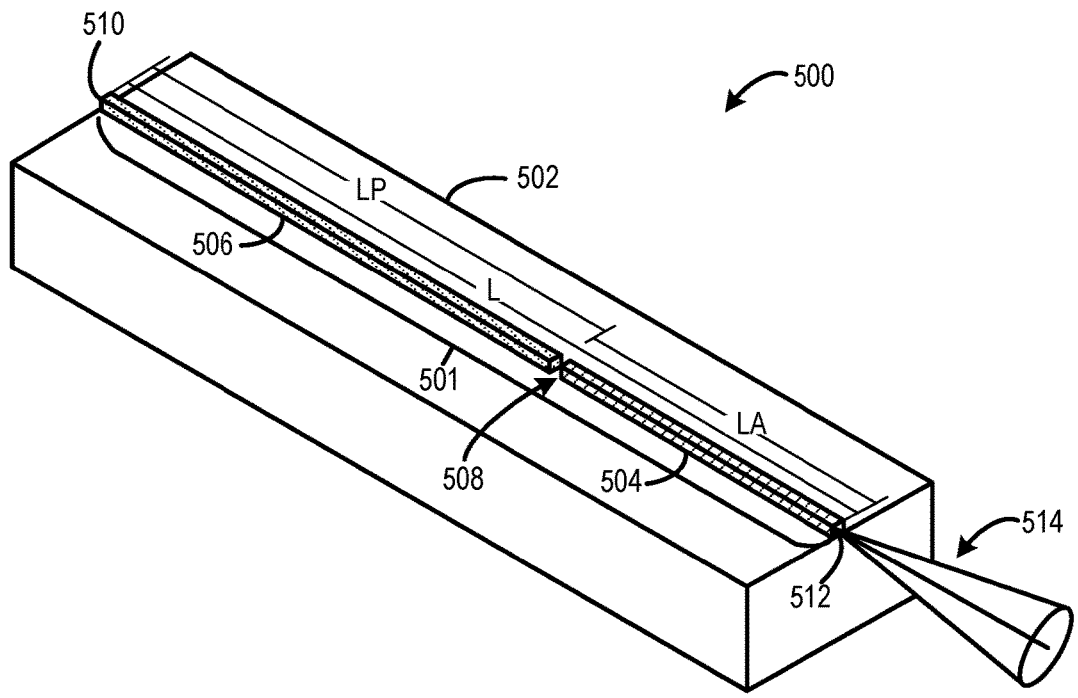
FIG. 5 schematically shows an edge-emitting laser including an optical cavity having an active gain section and a passive section.

Increasing the optical cavity in a manner that increases the length of the active gain section causes an increase in the laser threshold current, and hence the power consumption of the laser. To both reduce/avoid fringe interference and keep the laser power consumption low, the optical cavity may be configured to have two sections—an active gain section and a passive section. FIG. 5 schematically shows an example laser assembly 500 having a two-section optical cavity that is tuned to reduce fringe interference from a corresponding waveguide. The laser assembly 500 may be representative of any of the lasers 202A, 202B, 202C of the laser assembly 202 included in the near-eye display system 200 shown in FIG. 2. Continuing with this example, the laser assembly 500 may be particularly configured to reduce fringe interference caused by a waveguide, such as the waveguide 210 shown in FIG. 2.

The laser assembly 500 includes an optical cavity 501 positioned on a substrate 502. The optical cavity 501 includes an active gain section 504 and a passive section 506. The active gain section 504 may be optically coupled to the passive section 506 via a transmissive interface 508. In the depicted example, the active gain section 504 is edge coupled to the passive section 506 via the transmissive interface 508. The transmissive interface 508 may be any suitable interface between the two sections of the optical cavity 501 that supports low coupling loss. It will be appreciated that the active gain section 504 may be optically coupled to the passive section 506 in any suitable manner.

The active gain section 504 is the source of optical gain within the laser assembly 500. The active gain section 504 is configured to amplify an optical power of light reflecting within the optical cavity. The gain/amplification results from the stimulated emission of electronic or molecular transitions of an active gain medium of the active gain section 502 to a lower energy state from a higher energy state previously populated by a pump source. Laser pumping of the active gain section 504 may be performed using different pump sources, such as electrical currents or light generated by discharge lamps or by other lasers, for example. In one particular example, the active gain section 504 is configured as a reflective semiconductor optical amplifier (RSOA).

The passive section 506 increases a functional length of the optical cavity 501 without further amplifying the optical power of the light reflecting within the optical cavity 501. In some implementations, the passive section 506 is substantially transparent to the light reflecting within the optical cavity 501.

The passive section 506 includes a reflective end 510 and the active gain section 504 includes a selectively reflective end 512. The two reflective ends 510 and 512 may allow coherent light to reflect back and forth within the optical cavity. Each time a light beam passes through the active gain section, the optical power of the light beam may be amplified. The selectively reflective end 512 may be partially transparent to allow coherent light 514 to be output from the laser assembly 500. In other implementations, the reflective end 512 may be selectively reflective and/or partially transparent to allow coherent light to be output from the laser assembly 500 via the passive section 506.

The overall length (L) of the optical cavity 501 satisfies the fringe mitigation requirements while the power consumption is determined mainly by a length (LA) of the active gain section 504. The length (LA) of the active gain section 504 may be determined based on the laser requirement (e.g., power consumption and power output) for the particular application. A length (LP) of the passive section can be selected, given a particular active gain section length (LA), to provide an overall length (L) that avoids the fringe OPLs that are imposed by the waveguide. The length (LA) of the active gain section may be longer, shorter, or the same length as the length (LP) of the passive section. As one non-limiting example, the length (LA) of the active gain section is 330 μm and a total length of the optical cavity is 740 μm. The length (LA) of the active gain section, the length (LP) of the passive section, and/or the length (L) of the optical cavity may be any suitable length. Such a laser assembly 500 may consume less power than a laser having the same optical cavity length, but where the active gain section occupies the entire length of the optical cavity instead of achieving the greater optical cavity length with a passive section.

Figure 6:
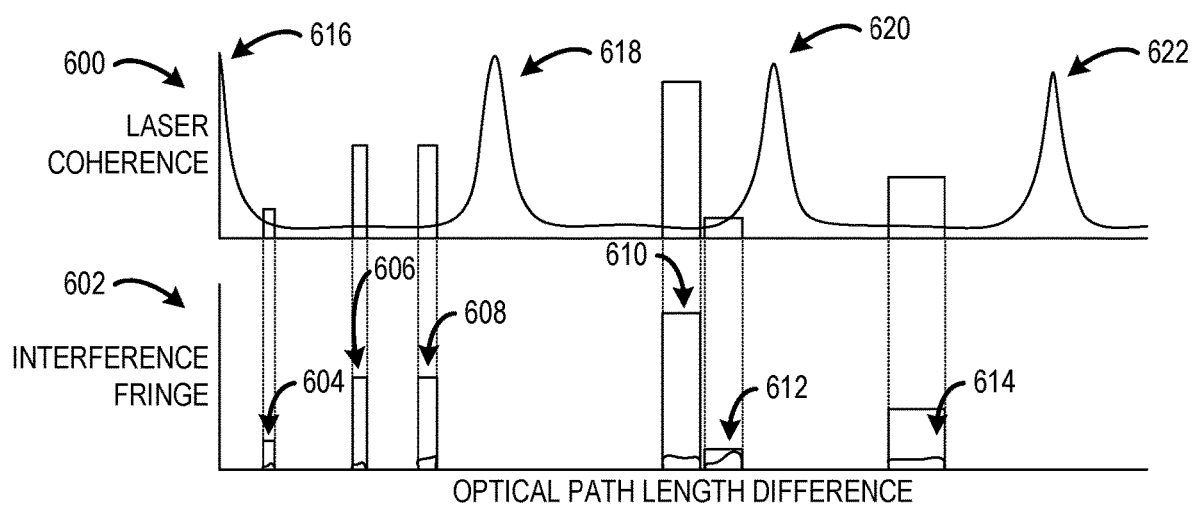
FIG. 6 shows a graph indicating that light output from the edge-emitting laser of FIG. 5 has coherence peaks that do not overlap with interference fringes of a waveguide.

FIG. 6 shows a graph 600 of an example composite waveform of laser light output from the laser assembly 500 shown in FIG. 5. The composite waveform has a plurality of coherence peaks spaced apart by valleys. Additionally, FIG. 6 shows a graph 602 of interference fringes of the waveguide 210 shown in FIG. 2. The length (L) of the optical cavity 501 of the laser assembly 500 is designed to avoid the overlap of the fringes with the laser coherence peaks. In particular, none of the interference fringes 604, 606, 608 610, 612, and 614 overlap with the coherence peaks 616, 618, 620, and 622. In this example, overlap can be reduced to a minimum by increasing the cavity length to 740 μm. Note that the coherence OPLs of a laser can be extracted from the laser's coherence function which shows the degree of laser temporal coherence for different OPLs and is proportional to the Fourier Transform of its spectrum.

Figure 7:
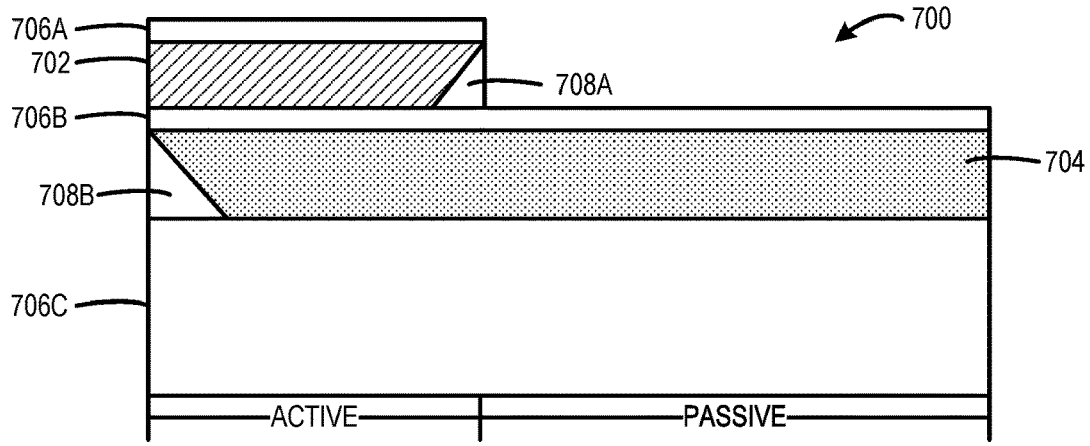
FIGS. 7-11 schematically show different example configurations of active and passive sections on a monolithic integration of an optical cavity of an edge-emitting laser.
Figure 8:
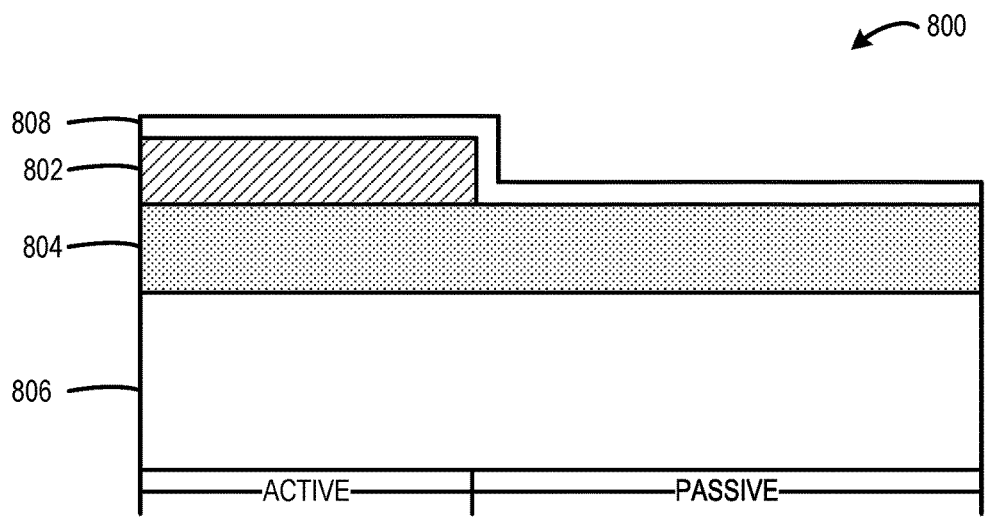

The laser assembly 500 may be fabricated in any suitable manner using any suitable fabrication techniques. FIGS. 7-11 show different techniques for fabricating the laser assembly 500. The depicted examples include active and passive sections on a monolithic integration of an optical cavity of the laser assembly. In some examples, the laser assembly 500 may be fabricated using a single step epitaxial process. FIGS. 7-8 show different examples of laser assemblies fabricated using different single step epitaxial processes.

FIG. 7 schematically shows an example laser assembly 700 including an active gain layer 702 and a passive layer 704. Both the active gain layer 702 and passive layer 704 may be grown in one single epitaxial step. Further, the transparent waveguide sections 706 (e.g., 706A, 706B, 706C) may be created afterwards by locally removing the active gain layer 702. In this approach special structures such as vertical tapers 708 (e.g., 708A, 708B) may be used to efficiently couple the light from the active gain layer 702 to the passive layer 704 and vice versa.

FIG. 8 schematically shows an example laser assembly 800 where a composite waveguide includes the active layer. In this example, no vertical coupling is used between the active and passive sections 802, 804 on the substrate layer 806. The challenge in this design is the discontinuity between the active and passive sections which causes coupling loss and reflection. However, the discontinuity can be reduced by covering the structure with a cladding layer 808 using an additional growth step. As an example, the cladding layer 808 may include gallium nitride (GaN) or gallium arsenide (GaAs).

Figure 9:
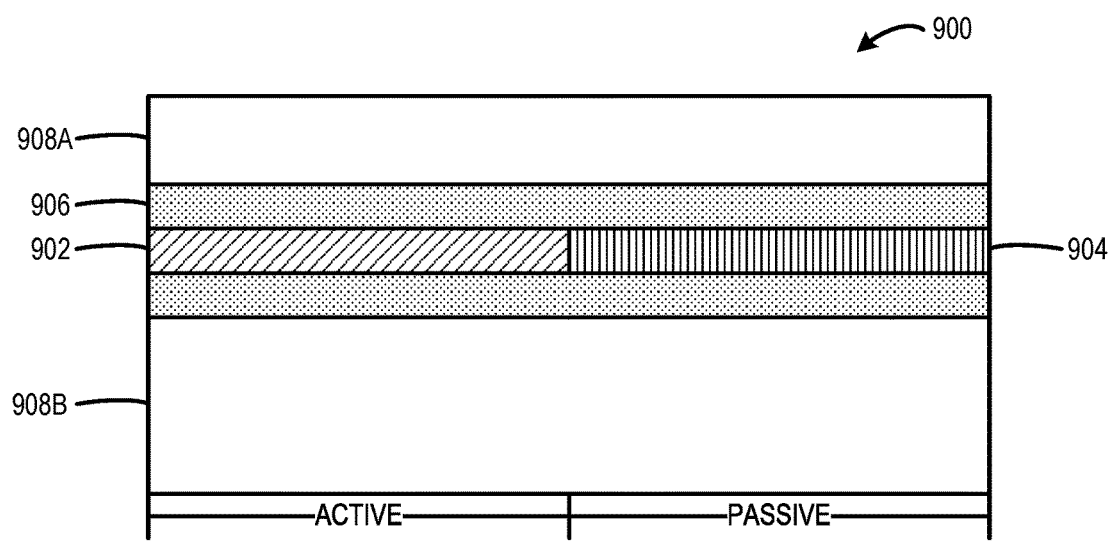

FIG. 9 schematically shows an example laser assembly 900 including an active gain section 902 and a passive section 904 formed using quantum wells. The active gain section (or layer) 902 includes a plurality of quantum wells. The passive section 904 may be initially formed as an active layer and then may be made passive by capping it with a material which generates vacancies in the semiconductor crystal of the quantum wells. These vacancies may be generated by implanting ions into the capping layer and diffusing the ions throughout the layer when the wafer is annealed at low temperature. These vacancies cause the quantum well atomic species to intermix with the atomic species of the adjacent barrier layers that leads to an increase of the effective bandgap of the quantum wells, such that the section becomes fully passive and transparent. In some examples, such intermixing can increase the band gap wavelength of the active material by more than 100 nm, so that it becomes fully transparent. During this process, the active gain section may be protected by a mask.

Figure 10:
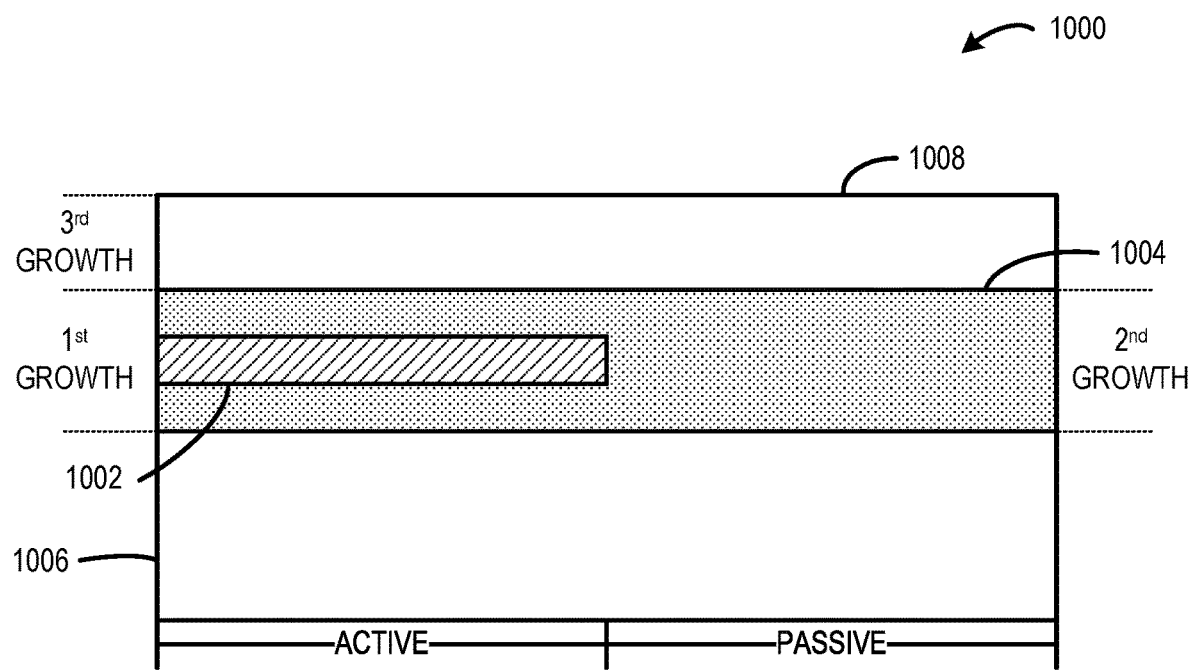

In some examples, the laser assembly may be fabricated using a multi-step epitaxial process. FIG. 10 shows an example laser assembly 1000 where an active gain section 1002 and a passive section 1004 are created in different growth steps. In a first growth step, the active gain section 1004 is grown on a substrate 1006. Next the active gain section 1002 is masked and the exposed area is etched away. In a second selective area regrowth step, the etched-away area is replaced with a transparent waveguide stack 1004. In a third growth step, a substrate layer 1008 is grown on the passive section 1004. Such a multi-step growth process may provide a large flexibility in the epitaxial layer structure and in the doping levels of the laser assembly 1000.

Figure 11:
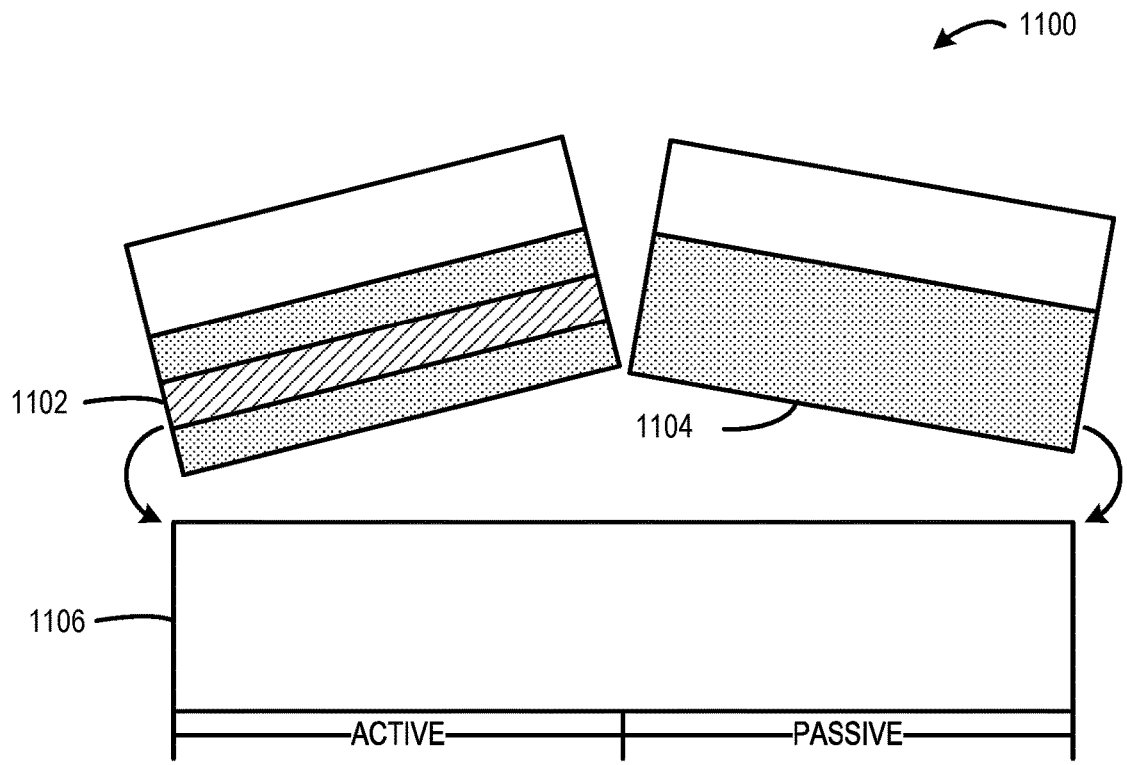

FIG. 11 shows an example laser assembly 1100 where each of an active gain section 1102 and a passive section 1104 is grown on separate wafers. Each wafer may be grown with an optimum epitaxial recipe for the particular section. Further, each of the active and passive sections 1102 and 1104 may be lifted off their separate substrates and placed onto a common carrier substrate 1106. The active gain section 1102 may be edge coupled with the passive section 1104 on the carrier substrate. It will be appreciated that a laser assembly may be made using any suitable fabrication technique.

Figure 12:
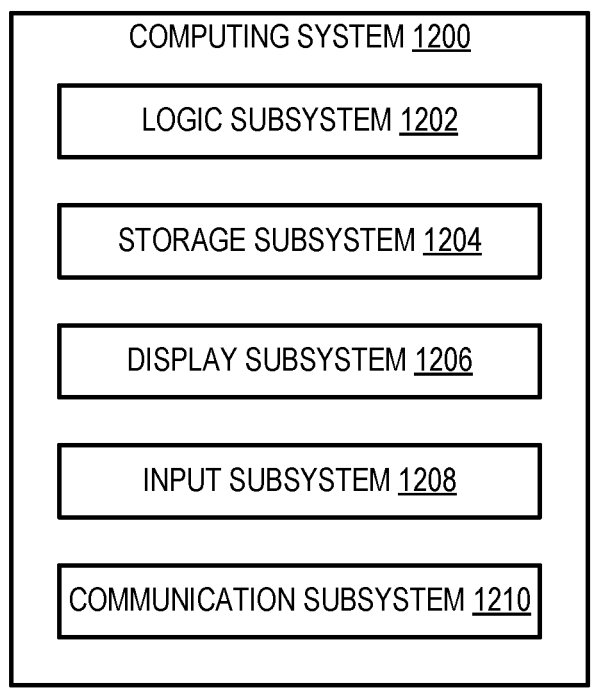
FIG. 12 schematically shows an example computing system.

FIG. 12 schematically shows a simplified representation of a computing system 1200 configured to provide any to all of the compute functionality described herein. Computing system 1200 may take the form of one or more head-mounted, near-eye display devices, personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices. For example, computing system 1200 may be representative of the head-mounted electronic device 102 in FIG. 1.

Computing system 1200 includes a logic subsystem 1202 and a storage subsystem 1204. Computing system 1200 may optionally include a display subsystem 1206, input subsystem 1208, communication subsystem 1210, and/or other subsystems not shown in FIG. 12.

Logic subsystem 1202 includes one or more physical devices configured to execute instructions. For example, the logic subsystem 1202 may be configured to execute instructions that are part of one or more applications, services, or other logical constructs. The logic subsystem 1202 may include one or more hardware processors configured to execute software instructions. Additionally or alternatively, the logic subsystem 1202 may include one or more hardware or firmware devices configured to execute hardware or firmware instructions. Processors of the logic subsystem 1202 may be single-core or multi-core, and the instructions executed thereon may be configured for sequential, parallel, and/or distributed processing. Individual components of the logic subsystem 1202 optionally may be distributed among two or more separate devices, which may be remotely located and/or configured for coordinated processing. Aspects of the logic subsystem 1202 may be virtualized and executed by remotely-accessible, networked computing devices configured in a cloud-computing configuration.

Storage subsystem 1204 includes one or more physical devices configured to temporarily and/or permanently hold computer information such as data and instructions executable by the logic subsystem 1202. When the storage subsystem 1204 includes two or more devices, the devices may be collocated and/or remotely located. Storage subsystem 1204 may include volatile, nonvolatile, dynamic, static, read/write, read-only, random-access, sequential-access, location-addressable, file-addressable, and/or content-addressable devices. Storage subsystem 1204 may include removable and/or built-in devices. When the logic subsystem 1202 executes instructions, the state of storage subsystem 1204 may be transformed—e.g., to hold different data.

Aspects of logic subsystem 1202 and storage subsystem 1204 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem 1202 and the storage subsystem 1204 may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices. As examples, the logic subsystem 1202 and the storage subsystem 1204 may be implemented as a controller, such as controller 220 shown in FIG. 2.

When included, display subsystem 1206 may be used to present a visual representation of data held by storage subsystem 1204. This visual representation may take the form of a graphical user interface (GUI). Display subsystem 1206 may include one or more display devices utilizing virtually any type of technology. In some implementations, display subsystem may include one or more virtual-, augmented-, or mixed reality displays. As an example, display subsystem 1206 may be implemented as the near-eye display system 100 shown in FIG. 1.

When included, input subsystem 1208 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 1210 may be configured to communicatively couple computing system 1200 with one or more other computing devices. Communication subsystem 1210 may include wired and/or wireless communication devices compatible with one or more different communication protocols. The communication subsystem 1210 may be configured for communication via personal-, local- and/or wide-area networks.

In an example, a system, comprises a waveguide, and an edge-emitting laser configured to lase coherent light into the waveguide, the edge-emitting laser including an optical cavity having an active gain section and a passive section, wherein the active gain section is configured to amplify an optical power of light reflecting within the optical cavity, wherein the passive section increases a functional length of the optical cavity without further amplifying the optical power of the light reflecting within the optical cavity, and wherein a total length of the optical cavity reduces fringe interference of the coherent light propagating through the waveguide. In this example and/or other examples, the total length of the optical cavity may be configured such that coherence peaks of optical path lengths (OPLs) of the coherent light output from the optical cavity do not match interfering OPLs in the waveguide. In this example and/or other examples, the length of the active gain section may be different than a length of the passive section. In this example and/or other examples, the length of the passive section may be greater than the length of the active gain section. In this example and/or other examples, the passive section may be substantially transparent to the light reflecting within the optical cavity. In this example and/or other examples, the active gain section may be edge coupled to the passive section. In this example and/or other examples, the active gain section and the passive section may be optically coupled via vertical optical tapers. In this example and/or other examples, the optical cavity may include a plurality of layers including a gallium nitride or gallium arsenide cladding layer. In this example and/or other examples, the active gain section may include a plurality of active quantum wells, and the passive section may include a plurality of passive quantum wells made transparent via ion implantation. In this example and/or other examples, the active gain section and the passive section may be formed as separate epitaxial layers on different substrates, and the active gain section and the passive section may be optically coupled to a common carrier substrate. In this example and/or other examples, an energy requirement of the edge-emitting laser may be less than an equivalent edge-emitting laser having an active gain section with a same length as the total length of the optical cavity.

In an example, a system comprises a waveguide, and an edge-emitting laser configured to lase coherent light into the waveguide, the edge-emitting laser including an optical cavity having an active gain section and a passive section, wherein the active gain section is configured to amplify an optical power of light reflecting within the optical cavity, wherein the passive section increases a functional length of the optical cavity, thereby reducing fringe interference of the coherent light propagating through the waveguide. In this example and/or other examples, the passive section may increase a functional length of the optical cavity without further amplifying the optical power of the light reflecting within the optical cavity. In this example and/or other examples, the functional length of the optical cavity may be configured such that coherence peaks of optical path lengths (OPLs) of the coherent light output from the optical cavity do not match interfering OPLs in the waveguide. In this example and/or other examples, the length of the active gain section may be different than a length of the passive section. In this example and/or other examples, the length of the passive section may be greater than the length of the active gain section. In this example and/or other examples, the passive section may be substantially transparent to the light reflecting within the optical cavity. In this example and/or other examples, the active gain section may be edge coupled to the passive section. In this example and/or other examples, the active gain section and the passive section may be optically coupled via vertical optical tapers.

In an example, a near-eye display comprises a waveguide configured to propagate coherent light towards a user's eye, and an edge-emitting laser configured to lase the coherent light into the waveguide, the edge-emitting laser including an optical cavity having an active gain section optically coupled to a passive section.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A system, comprising:
   a waveguide; and
   an edge-emitting laser configured to emit coherent light out of the edge-emitting laser into the waveguide, the edge-emitting laser including an optical cavity having an active gain section and a passive section;
   wherein the active gain section is configured to amplify an optical power of light reflecting within the optical cavity,
   wherein the passive section increases a functional length of the optical cavity without further amplifying the optical power of the light reflecting within the optical cavity, and
   wherein a total length of the optical cavity is configured such that coherence peaks of optical path lengths (OPLs) of the coherent light output from the optical cavity and into the waveguide do not match interfering OPLs in the waveguide.

2. The system of claim 1, wherein the length of the active gain section is different than a length of the passive section.

3. The system of claim 2, wherein the length of the passive section is greater than the length of the active gain section.

4. The system of claim 1, wherein the passive section is substantially transparent to the light reflecting within the optical cavity.

5. The system of claim 1, wherein the active gain section is edge coupled to the passive section.

6. The system of claim 1, wherein the active gain section and the passive section are optically coupled via vertical optical tapers.

7. The system of claim 1, wherein the optical cavity includes a plurality of layers including a gallium nitride or gallium arsenide cladding layer.

8. The system of claim 1, wherein the active gain section includes a plurality of active quantum wells, and wherein the passive section includes a plurality of passive quantum wells made transparent via ion implantation.

9. The system of claim 1, wherein the active gain section and the passive section are formed as separate epitaxial layers on different substrates, and the active gain section and the passive section are optically coupled to a common carrier substrate.

10. The system of claim 1, wherein an energy requirement of the edge-emitting laser is less than an equivalent edge-emitting laser having an active gain section with a same length as the total length of the optical cavity.

11. The system of claim 1, wherein the total length of the optical cavity is greater than a maximum optical path length of interfering OPLs in the waveguide.

12. A system, comprising:
a waveguide; and
an edge-emitting laser configured to emit coherent light out of the edge-emitting laser into the waveguide, the edge-emitting laser including an optical cavity having an active gain section and a passive section;
wherein the active gain section is configured to amplify an optical power of light reflecting within the optical cavity,
wherein the passive section increases a functional length of the optical cavity, and wherein a total length of the optical cavity is configured such that coherence peaks of optical path lengths (OPLs) of the coherent light output from the optical cavity and into the waveguide do not match interfering OPLs in the waveguide.

13. The system of claim 12, wherein the passive section increases a functional length of the optical cavity without further amplifying the optical power of the light reflecting within the optical cavity.

14. The system of claim 12, wherein the length of the active gain section is different than a length of the passive section.

15. The system of claim 14, wherein the length of the passive section is greater than the length of the active gain section.

16. The system of claim 12, wherein the passive section is substantially transparent to the light reflecting within the optical cavity.

17. The system of claim 12, wherein the active gain section is edge coupled to the passive section.

18. The system of claim 12, wherein the active gain section and the passive section are optically coupled via vertical optical tapers.

19. The system of claim 12, wherein the total length of the optical cavity is greater than a maximum optical path length of interfering OPLs in the waveguide.

20. A near-eye display, comprising:
a waveguide configured to propagate coherent light towards a user's eye; and
an edge-emitting laser configured to emit the coherent light out of the edge-emitting laser into the waveguide, the edge-emitting laser including an optical cavity having an active gain section optically coupled to a passive section, wherein a total length of the optical cavity is configured such that coherence peaks of optical path lengths (OPLs) of the coherent light output from the optical cavity and into the waveguide do not match interfering OPLs in the waveguide.

* * * * *